US009240435B2

(12) United States Patent
Yoshida et al.

(10) Patent No.: US 9,240,435 B2
(45) Date of Patent: Jan. 19, 2016

(54) ORGANIC EL DISPLAY (75) Inventors: Hidehiro Yoshida, Osaka (JP); Kenji Okumoto, Kyoto (JP); Tsuneyuki Ejima, Osaka (JP); Shuhei Nakatani, Osaka (JP)

(73) Assignee: JOLED INC, Tokyo (JP)

( * ) Notice: Subject to any disclaimer, the term of this patent is extended or adjusted under 35 U.S.C. 154(b) by 58 days.

(21) Appl. No.: 13/376,476

(22) PCT Filed: May 18, 2010

(86) PCT No.: PCT/JP2010/003343
§ 371 (c)(1),
(2), (4) Date: Dec. 6, 2011

(87) PCT Pub. No.: WO2010/143360
PCT Pub. Date: Dec. 16, 2010

(65) Prior Publication Data
US 2012/0080694 A1    Apr. 5, 2012

(30) Foreign Application Priority Data
Jun. 11, 2009  (JP) .................................. 2009-140542

(51) Int. Cl.
*H01L 33/36* (2010.01)
*H01L 51/50* (2006.01)
(Continued)

(52) U.S. Cl.
CPC ........ *H01L 27/3211* (2013.01); *H01L 27/3283* (2013.01); *H01L 51/5262* (2013.01); *H01L 2251/5315* (2013.01); *H01L 2251/558* (2013.01)

(58) Field of Classification Search
CPC ..... H01L 51/50; H01L 27/3212; H01L 33/36; H01L 51/52; H01L 51/56
USPC ................... 257/89, 59, 72, 40; 313/504, 505
See application file for complete search history.

(56) References Cited

U.S. PATENT DOCUMENTS 7,459,177 B2 * 12/2008 Kimura et al. ................ 427/162
7,541,734 B2    6/2009 Yamazaki et al.
(Continued)

FOREIGN PATENT DOCUMENTS

JP    2000-323277 A    11/2000
JP    2003-272855 A    9/2003
(Continued)

OTHER PUBLICATIONS

English Machine Translation, Kimura et al., "Film Forming Method, Manufacturing Method of Electrooptical Substrate, Maanufacturing Method of Electrooptical Device, Funtional Film, Electrooptical Substrate, Electrooptical Device and Electronic Equipment" Nov. 29, 2007, pp. 1-38.*

(Continued)

*Primary Examiner* — Evan Pert
*Assistant Examiner* — Damon Hillman
(74) *Attorney, Agent, or Firm* — Pearne & Gordon LLP (57) ABSTRACT

Disclosed is a coated type organic EL display wherein the light extraction efficiencies of all organic light-emitting elements are improved even when the organic light-emitting elements have different organic light-emitting layers for respective emission colors. Specifically disclosed is an organic EL display which comprises a substrate, a red organic light-emitting element (R), a green organic light-emitting element (G), and a blue organic light-emitting element (B), said organic light-emitting elements being arranged on the substrate. Each of the organic light-emitting elements has a pixel electrode that is a reflective electrode, a functional layer that is formed on the pixel electrode by coating, an organic light-emitting layer that is arranged on the functional layer, a counter electrode that is a transparent electrode arranged on the organic light-emitting layer, and a tapered bank that defines the functional layer formed by coating. The amounts of the functional layers formed by coating are different among the element (R), the element (G) and the element (B), and the tapered angles of the banks defining the functional layers are different among the element (R), the element (G) and the element (B).

2 Claims, 8 Drawing Sheets (51) Int. Cl.
*H01L 51/56* (2006.01)
*H01L 27/32* (2006.01)
*H01L 51/52* (2006.01)

(56) References Cited

U.S. PATENT DOCUMENTS

| | | | |
|---|---|---|---|
| 7,781,963 B2 * | 8/2010 | Yoshida et al. | 313/506 |
| 8,013,514 B2 * | 9/2011 | Park et al. | 313/501 |
| 2003/0044639 A1 | 3/2003 | Fukuda | |
| 2005/0218792 A1 | 10/2005 | Jianpu et al. | |
| 2006/0124920 A1 | 6/2006 | Kimura | |
| 2007/0188093 A1 | 8/2007 | Nagara et al. | |
| 2008/0231179 A1 | 9/2008 | Abe et al. | |
| 2008/0233669 A1 | 9/2008 | Hirakata et al. | |
| 2008/0237615 A1 * | 10/2008 | Lee et al. | 257/89 |
| 2009/0224664 A1 | 9/2009 | Yoshida et al. | |
| 2011/0042691 A1 * | 2/2011 | Hayata et al. | 257/88 |
| 2011/0140596 A1 | 6/2011 | Yoshida et al. | |

FOREIGN PATENT DOCUMENTS

| | | | | |
|---|---|---|---|---|
| JP | 2005-317255 A | 11/2005 | | |
| JP | 2006-004743 A | 1/2006 | | |
| JP | 2007-250520 A | 9/2007 | | |
| JP | 2007-310156 A * | 11/2007 | | G02B 5/20 |
| JP | 2008-270182 A | 11/2008 | | |
| JP | 2008-270731 A | 11/2008 | | |
| JP | 2009-117391 A | 5/2009 | | |
| JP | 2010097697 A * | 4/2010 | | |

OTHER PUBLICATIONS

International Search Report for PCT/JP2010/003343 dated Aug. 3, 2010.

Abstract of CN 101271869 A, dated Sep. 24, 2008.

Office Action for U.S. Appl. No. 14/036,380 dated Oct. 24, 2014.

* cited by examiner

ORGANIC EL DISPLAY

TECHNICAL FIELD

The present invention relates to an organic EL display.

BACKGROUND ART

An organic EL display has a plurality of organic light emitting elements arranged on a substrate. The organic light emitting element basically has a pixel electrode, an organic light emitting layer and a counter electrode. Holes and electrons form electron-hole pairs in the organic light emitting layer, and function as luminescent exciters such that the organic light emitting layer emits light. Lights emitted from the organic light emitting layer are extracted outside through a transparent electrode of the pixel electrode or counter electrode. This light extraction efficiency is several %, and improvement of the light extraction efficiency is demanded.

To increase the light extraction efficiency, one of the pixel electrode and counter electrode is used as a transparent electrode, and the other one is used as a reflective electrode (see, for example, Patent Literature 1 and Patent Literature 2). This is because lights emitted from the organic light emitting layer are efficiently extracted from the transparent electrode. In this case, part of lights emitted from the organic light emitting layer are emitted toward the transparent electrode, and the other part of lights go toward the reflective electrode and are reflected on the reflective electrode toward the transparent electrode. Consequently, by preventing attenuation of both of light going from the organic light emitting layer to the transparent electrode and light reflected by the reflective electrode toward the transparent electrode, it is possible to increase the light extraction efficiency.

A technique has been reported of arranging a transparent conductive film between a metal electrode which is a reflective electrode and an organic light emitting layer and adjusting an optical distance from an organic light emitting layer to a reflective electrode such that extracted light does not attenuate (see Patent Literature 3; Patent Literature 4 and Patent Literature 5).

Further, a technique is known of forming a function layer (for example, organic light emitting layer) of an organic light emitting element by coating and drying a solution including a material of the function layer. A coating area of the solution is defined by partition walls (banks). For example, a technique has been reported of using fluorine resin for the partition walls (banks) which define the coating area (see Patent Literature 6 and Patent Literature 7). By adequately setting the heights and taper angles of the partition walls, it is necessary to set the thickness of the function layer formed by coating and improve film thickness uniformity.

A shape profile of the function layer formed by coating varies depending on the solute of a solution and the type of solvent, and content ratio of these. For example, when a color filter film of each color of the organic light emitting element is formed by coating, the solute of a solution for coating varies per color. Hence, when the heights and taper angles of the partition walls (banks) are the same, the shape of the color filter film varies per color. Hence, a technique has been reported of increasing film thickness uniformity of color filter films by changing the heights and taper angles of the partition walls (banks) per color of the color filter (see Patent Literature 8).

CITATION LIST

Patent Literature

PTL 1
Japanese Patent Application Laid-Open No. 2007-250520
PTL 2
US Patent No. 2007/0188093
PTL 3
Japanese Patent Application Laid-Open No. 2003-272855
PTL 4
Japanese Patent Application Laid-Open No. 2000-323277
PTL 5
U.S. Pat. No. 2003/0044639
PTL 6
Japanese Patent Application Laid-Open No. 2009-117391
PTL 7
US Patent No. 2009/0224664
PTL 8
Japanese Patent Application Laid-Open No. 2007-310156

SUMMARY OF INVENTION

Technical Problem

An organic electric field light emitting element has an organic light emitting element R which emits red light, an organic light emitting element G which emits green light and an organic light emitting element B which emits blue light. Although all organic light emitting layers included in each organic light emitting element are colored with white light using a color filter as an organic light emitting layer which emits white light, an organic light emitting layer which emits red light, organic light emitting layer which emits green light or organic light emitting layer which emits blue light may be arranged per organic light emitting element.

When a component of an organic light emitting layer varies, the wavelength $\lambda$ of light emitted from the organic light emitting layer varies. Further, depending the wavelength $\lambda$, the condition of increasing the light extraction efficiency varies. Hence, the condition of increasing the light extraction efficiency varies per element.

It is therefore an object of the present invention to increase the light extraction efficiency from all organic light emitting elements in a coating type organic EL display even when organic light emitting elements have different organic light emitting layers per light emission color.

Solution to Problem

The inventors of the present invention have studied to increase respective light extraction efficiencies of all organic light emitting elements by adjusting the thickness of "a function layer" arranged between an organic light emitting layer and reflective electrode formed by coating in each organic light emitting element.

To adjust the thickness of the function layer formed by coating, a coating amount of a solution including a functional material is adjusted. Meanwhile, the coating amount of a solution is determined to some extent according to the shape of a bank which defines each organic EL element, and therefore adjustment of the coating amount is limited. By contrast with this, to adjust the thickness of the function layer formed by coating, the concentration of a solution including a functional material is adjusted. However, as described above, depending on the concentration of a solution for coating, the shape profile of the function layer to be formed changes.

Therefore, when the bank of each organic light emitting element is the same, it is difficult to adequately control the shapes of function layers of all elements.

Although the details will be described below, the inventors of the present invention found the important relationship between the concentration of a solution of a functional material for coating, the shapes of the banks and the shape of the function layer formed by drying. That is, the inventors have found that, by adequately controlling banks per element according to the concentration of a solution for coating, it is possible to increase the light extraction efficiencies of all organic light emitting elements.

The first aspect of the present invention relates to an organic EL display panel. This organic EL display panel may be a top emission type.

[1] An organic EL display including: a substrate; an organic light emitting element R which is arranged on a substrate and emits red light; an organic light emitting element G which emits green light; and an organic light emitting element B which emits blue light, wherein each of the organic light emitting elements has a pixel electrode which is a reflective electrode, a function layer which is formed by coating on the pixel electrode, an organic light emitting layer which is arranged on the function layer, a counter electrode which is a transparent electrode and is arranged on the organic light emitting layer and a bank of a tapered shape which defines the function layer formed by coating; a volume of the function layer formed by coating varies between the element R, the element G and the element B; and a taper angle of the bank which defines the function layer varies between the element R, the element G and the element B.

[2] The organic EL display according to [1], wherein the function layer formed by coating is an electronic block layer or a hole transport layer.

[3] The organic EL display according to [1], wherein the function layer formed by coating is a hole injection layer.

[4] The organic EL display according to [1], wherein a thickness of the function layer formed by coating varies between the element R, the element G and the element B.

The second aspect of the present invention relates to the following organic EL display panel. This organic EL display panel may be a bottom emission type.

[5] An organic EL display including: a substrate; an organic light emitting element R which is arranged on a substrate and emits red light; an organic light emitting element G which emits green light; and an organic light emitting element B which emits blue light, wherein each of the organic light emitting elements has a pixel electrode which is a transparent electrode, an organic light emitting layer which is arranged on the pixel electrode, a function layer which is formed by coating on the organic light emitting layer, a counter electrode which is a reflective electrode and is arranged on the function layer and a bank of a tapered shape which defines the function layer formed by coating; a volume of the function layer formed by coating varies between the element R, the element G and the element B; and a taper angle of the bank which defines the function layer varies between the element R, the element G and the element B.

[6] The organic EL display according to [5], wherein the function layer formed by coating is an electronic transport layer.

[7] The organic EL display according to [5], wherein a thickness of the function layer formed by coating varies between the element R, the element G and the element B.

Advantageous Effects of Invention

With the organic EL display according to the present invention, even when components of organic light emitting layers included in organic light emitting elements vary per light emission color, light emission extraction efficiencies of all organic light emitting elements are increased. Consequently, it is possible to provide an organic EL display of a high brightness and a high contrast. Moreover, the organic EL display according to the present invention is a coating type organic EL display, so that it is possible to increase the size of displays and improve productivity of displays.

DESCRIPTION OF EMBODIMENTS

Organic EL Display

The organic EL display according to the present invention has a substrate, and a plurality of organic light emitting elements arranged on the substrate. The organic light emitting elements include an organic light emitting element R which emits red light, an organic light emitting element G which emits green light and an organic light emitting element B which emits blue light. Each organic light emitting element preferably has an organic light emitting layer of a different component per R, G and B.

The substrate is not limited in particular, and is, for example, a glass substrate. Further, a thin film transistor (driving TFT) may be arranged on the substrate, and a source or drain electrode of the thin film transistor (TFT) may be connected with a pixel electrode (described below) of the organic light emitting element.

Each organic light emitting element has at least a pixel electrode, an organic light emitting layer and a counter electrode. The organic light emitting layer may be formed by coating. Further, each organic light emitting element has a bank which defines the organic light emitting layer or a function layer formed by coating (described below).

Generally, the pixel electrode of the organic light emitting element is an anode electrode, and the counter electrode is a cathode electrode. To provide a top emission type organic EL display, the pixel electrode is used as a reflective electrode, and a counter electrode is used as a transparent electrode. To provide a bottom emission type organic EL display panel, the pixel electrode is used as a transparent electrode, and the counter electrode is used as a reflective electrode.

Examples of the reflective electrode include a metal electrode such as aluminum or silver and an alloy electrode such as APC (AgPdCu). Examples of the transparent electrode include an ITO electrode and IZO electrode. Further, the transparent electrode may be a MgAg thin film. The MgAg thin film is known as a semi-transparent electrode, and has required transparency as long as the thickness is at the level of nanometer.

Figure 1:
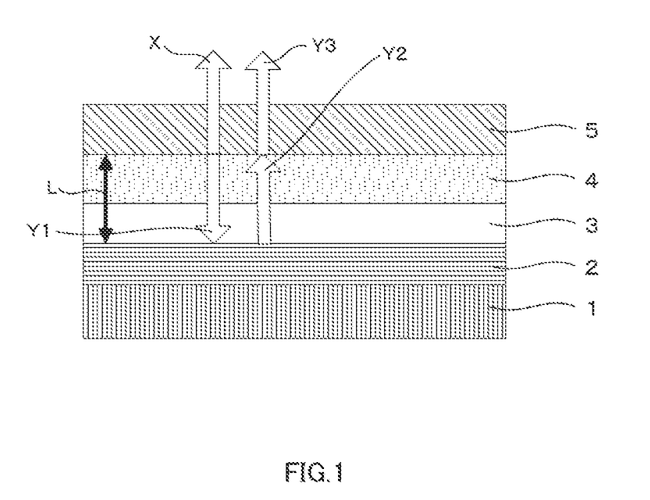
FIG. 1 is a schematic sectional view of an organic EL element included in an organic EL display according to the present invention, and is a view for describing an optical distance L.

FIG. 1 is a view illustrating the state where an organic light emitting element is arranged on substrate 1. Although, as a simplified configuration, substrate 1, reflective electrode 2, function layer 3 formed by coating, organic light emitting layer 4 of each color and transparent electrode 5 are illustrated, the organic light emitting element may naturally include other components.

As illustrated in FIG. 1, part of lights emitted from organic light emitting layer 4 go toward transparent electrode 5, and pass transparent electrode 5 (see X). By contrast with this, the other part of lights go toward reflective electrode 2 (see Y1), are reflected by reflective electrode 2, pass organic light emitting layer 4, go toward transparent electrode 5 (see Y2) and pass transparent electrode 5. In this case, when light indicated by X and light indicated by Y3 can enhance each other, the efficiency to extract light from transparent electrode 5 increases.

The condition that light indicated by X and light indicated by Y3 enhance each other depends on a light emitting wavelength α from organic light emitting layer 4 and an optical distance L from organic light emitting layer 4 to reflective electrode 2. The optical distance L depends on the "thickness" and "refractive index" of organic light emitting layer 4 and each layer (only function layer 3 in FIG. 1) layered between organic light emitting layer 4 and the reflective electrode. More specifically, the optical distance L is expressed by the following equation.

$$L = \sum_i n_i d_i \quad \text{[Formula 1]}$$

In the above equation, $d_i$ (i=1, 2, 3 . . . ) indicates the "thickness" of the organic light emitting layer and each layer layered between the organic light emitting layer and reflective electrode. In the above equation, $n_i$ (i=1, 2, 3 . . . ) indicates the "refractive index" of the organic light emitting layer and each layer layered between the organic light emitting layer and reflective electrode.

When the optical distance L expressed by the above equation satisfies the light emission wavelength α of the organic light emitting layer and the following relationship, light indicated by X and light indicated by Y3 in FIG. 1 can enhance each other.

$$L = \frac{2n+1}{4}\lambda \quad \text{[Formula 2]}$$
$$(n = 0, 1, 2, \ldots)$$

As described above, each organic light emitting element of the organic EL display panel according to the present invention has an organic light emitting layer of a different component per R, G and B. A light emission wavelength $\alpha_R$ of the organic light emitting layer included in organic light emitting element R, a light emission wavelength $\alpha_G$ of the organic light emitting layer included in organic light emitting element G and a light emission wavelength $\alpha_9$ of the organic light emitting layer included in organic light emitting element B are different from each other. Hence, the optical distance L at which light indicated by X and light indicated by Y3 can enhance each other varies per R, G and B of the organic light emitting elements.

The organic EL display according to the present invention adjusts the thickness of the function layer arranged between the organic light emitting layer and reflective electrode per R, G and B to adequately adjust the optical distance L of the organic light emitting element per R, G and B. The function layer for which the thickness is adjusted is also referred to as a "function layer M" below.

The function layer (function layer M) arranged between the organic light emitting layer and reflective electrode differs in whether the organic EL display is the top emission or bottom emission type.

When the organic EL display adopts the top emission type, the reflective electrode is generally an anode electrode, and therefore, examples of the function layer M include an electronic block layer, a hole transport layer (also referred to as "interlayer") and a hole injection layer. The hole transport layer which forms the function layer M is made of, for example, an aromatic tertiary amine, or polymer or oligomer which includes an aromatic tertiary amine as a structural unit. Examples of the aromatic tertiary amine include triphenylamine. The polymer or oligomer which includes an aromatic tertiary amine as a structural unit is, for example, a copolymer including a fluorene unit and triphenylamine unit. The hole injection layer is made of, for example, PEDOT (3,4-polyethylenedioxythiophene). Further, if the function layer M can be formed by coating, the function layer M may be a transparent conductive film (coating type ITO film).

The function layer M is preferably a hole transport layer. This is because, even if the thickness of the hole transport layer increases or decreases to some extent, light emission characteristics of organic light emitting elements are not likely to be influenced.

When the organic EL display adopts the bottom emission type, the reflective electrode is generally a cathode electrode, and therefore, examples of the function layer M include an electronic transport layer, and a transparent conductive film which can be formed by coating (for example, coating type ITO film).

With the organic EL display according to the present invention, the thickness of the function layer (function layer M) which is arranged between the organic light emitting layer and reflective electrode of the organic light emitting element and which is formed by coating varies per R, G and B. To adjust the thickness of the function layer (function layer M) formed by coating, the volume of a functional material for coating needs to be adjusted. To adjust the volume of a functional material for coating, a coating capacity of the solution including the functional material may be adjusted. However, the coating area of the organic light emitting element is defined by the bank, thereby limiting the capacity of a solution which can be provided on the coating area to some extent. Hence, to adjust the volume of the functional material for coating, the concentration of the solution including the functional material may be adjusted.

Figure 2A:
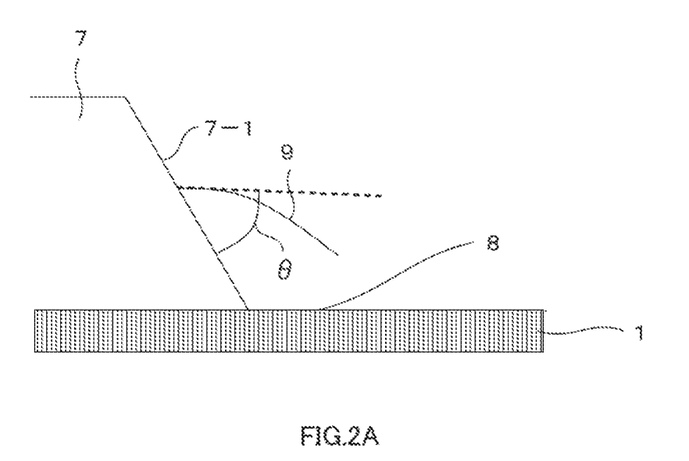
FIG. 2 is a view describing a relationship between a concentration of a functional material solution, a taper angle of a tapered shape of a bank and a shape of a function layer to be formed.
Figure 2B:
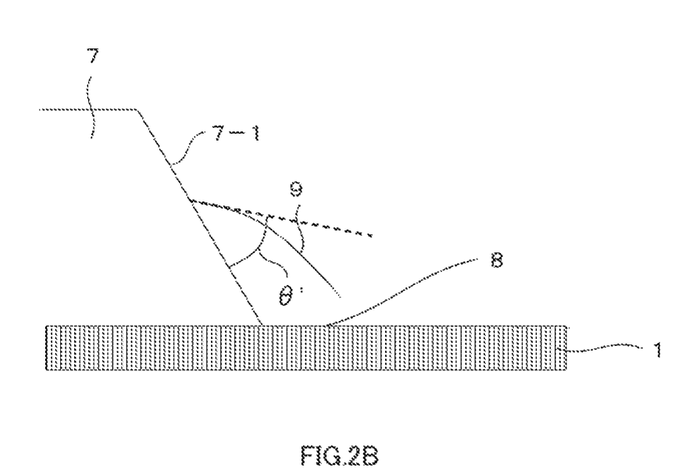

When the coating capacity or concentration of the solution including the functional material is adjusted, the viscosity of the functional material solution at a certain capacity changes. The viscosity of the solution used for coating significantly influences the mode of drying the solution in the coating area defined by the bank. More specifically, while, as illustrated in FIG. 2A, when coating area 8 defined by bank 7 contains a functional material solution of a high concentration, the contact angle θ between tapered face 7-1 of the bank and dried function layer 9 is likely to increase, as illustrated in FIG. 2B, when coating area. 8 defined by bank 7 contains a functional material solution of a low concentration, a contact angle θ' between tapered face 7-1 of bank 7 and dried function layer 9 decreases. Hence, when areas defined by the bank of the same shape and the same taper angle in particular contain functional material solutions of different concentrations, function layers of different shapes are formed per concentration.

The difference in this contact angle θ is produced by the difference in a receding contact angle while liquid droplets are dried. When the concentration of a solution of liquid droplets in the coating area is high and viscosity is high, the receding contact angle becomes high, and, when the concentration of the solution of the liquid droplets in the coating area is low and the viscosity is low, the receding contact angle becomes small.

Figure 3A:
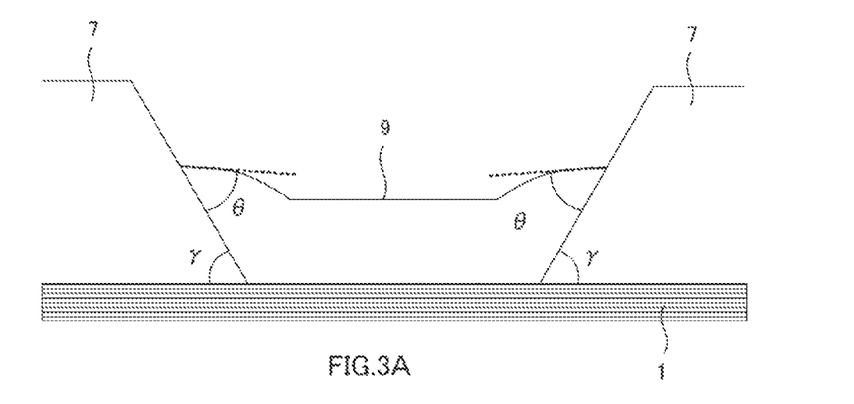
FIG. 3 is a view describing a relationship between a concentration of a functional material solution, a taper angle of a tapered shape of a bank and a shape of a function layer to be formed.
Figure 3B:
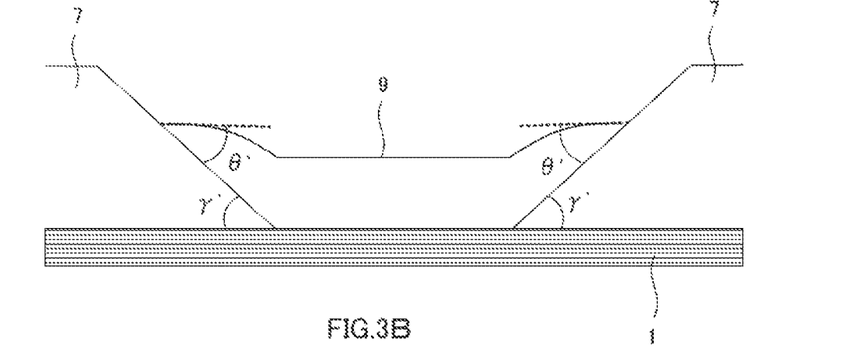

Bank 7 which defines the coating area needs to be arranged to increase thickness uniformity of function layer 9 formed by coating. Although the relationship between the concentration of the functional material solution, taper angle of the bank and the shape of the function layer (for example, thickness uniformity) does not necessarily determined uniquely, the following is generally derived. That is, when a functional material solution of a high concentration is provided to a coating area, by increasing the taper angle γ of bank 7, thickness uniformity of the function layer can increase even if the contact angle θ between the tapered face of the bank and function layer increases (see FIG. 3A). By contrast with this, when a functional material solution of a low concentration is provided to a coating area, by decreasing the taper angle γ' of bank 7, thickness uniformity of the function layer can increase even if the contact angle θ' between the tapered face of the bank and function layer decreases (see FIG. 3B).

Thus, the thickness of the function layer M is adjusted per R, G and B to adequately set the optical distance L of each organic light emitting element of the organic EL display according to the present invention per R, G and B, the volume of the functional material for coating is adjusted to adjust the thickness of the function layer M, and the coating capacity or concentration of the functional material solution for coating is adjusted to adjust the volume of the functional material for coating. Further, according to the concentration of the functional material solution in the coating area, the taper angle of the bank which defines the coating area of each organic light emitting element is adjusted. As a result, with each organic light emitting element of the organic EL display according to the present invention, the volume of the function layer M varies per R, G and B, and the taper angle of the bank varies.

Figure 4:
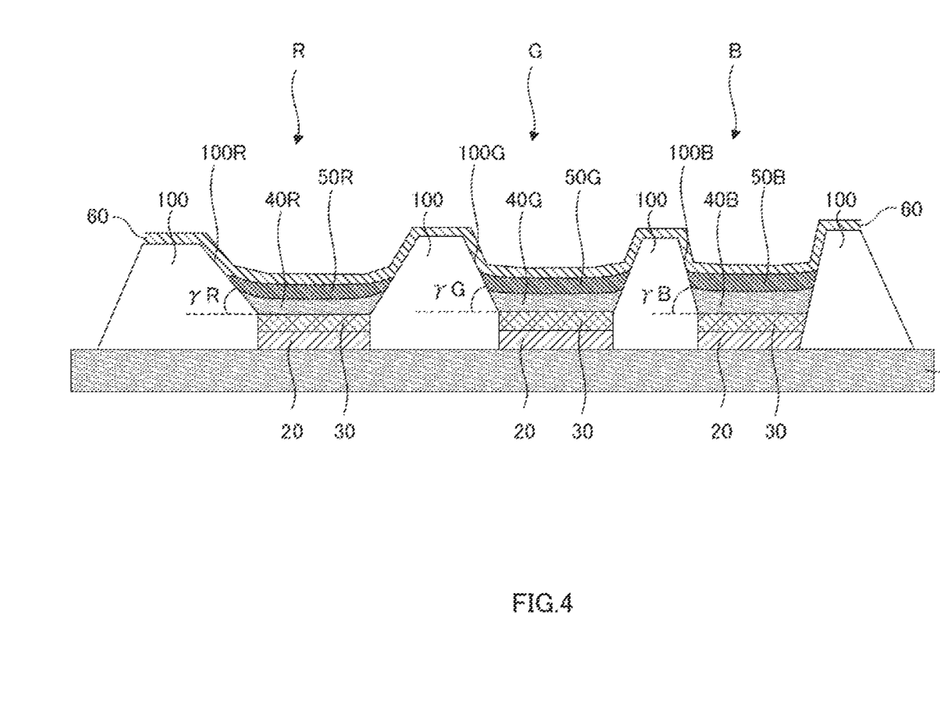
FIG. 4 is a sectional view illustrating an example of an organic EL display according to the present invention.

FIG. 4 illustrates an example of the organic EL display according to the present invention. FIG. 4 illustrates cross sections of organic light emitting element R, organic light emitting element G and organic light emitting element B of the organic EL display. Each organic light emitting element is arranged on substrate 10, and has pixel electrodes 20 which are the reflective electrodes, hole injection layers 30, hole transport layers 40 (40R, 40G and 40B), organic light emitting layers 50 (50R, 50G and 50B) and counter electrodes 60 which are transparent electrodes. Organic light emitting layer 50R included in organic light emitting element R produces red light, organic light emitting layer 50G included in organic light emitting element G produces green light and organic light emitting layer 50B included in organic light emitting element B produces blue light.

Hole transport layer 40 (40R, 40G and 40B) of each organic light emitting element and organic light emitting layer 50 (50R, 50G and 50B) are formed by coating, and defined by banks 100. The taper angle γR of tapered face 100R of the bank which defines organic light emitting element R, taper angle γG of tapered face 100G of the bank which defines organic light emitting element. G and the taper angle γB of tapered face 100B of the bank which defines organic light emitting element B, satisfy the relationship of following equation (1).

$$\gamma R < \gamma G < \gamma B \quad (1)$$

Further, hole transport layer 40R, hole transport layer 40G and hole transport layer 40B differ in the thickness and the volume of the material, and satisfy the following equation (2).

$$40R < 40G < 40B \quad (2)$$

Figure 5:
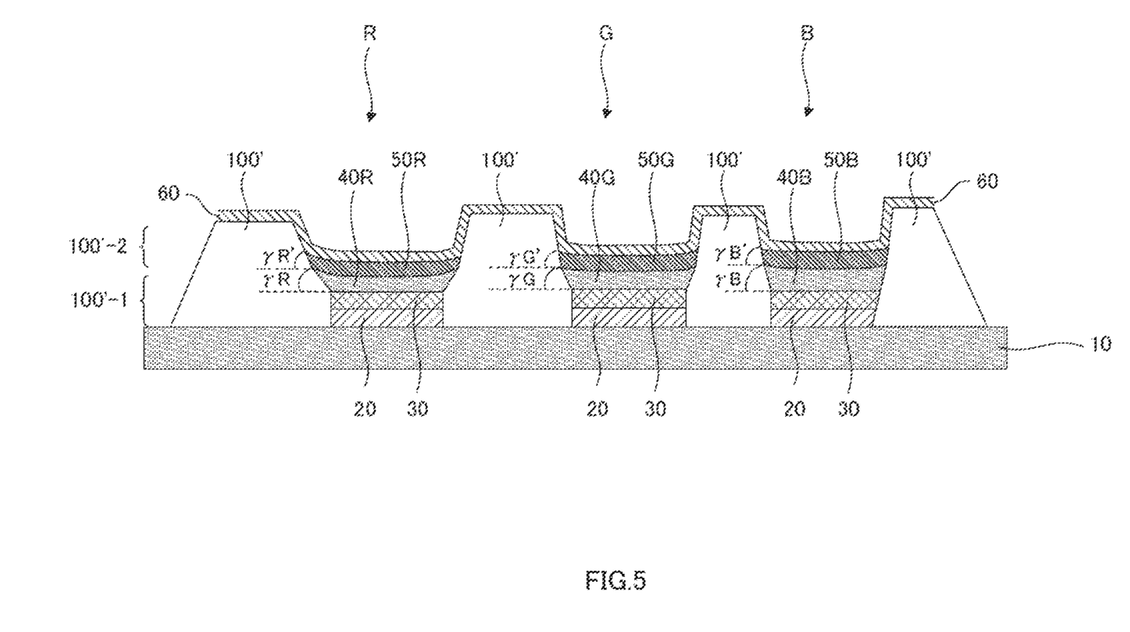
FIG. 5 is a sectional view illustrating another example of an organic EL display according to the present invention.

FIG. 5 illustrates another example of the organic EL display according to the present invention. FIG. 5 is a sectional view illustrating each organic light emitting element of the organic EL display. The organic EL display employs the same layer configuration as the above organic EL display. That is, the organic EL display has pixel electrodes 20, hole injection layers 30, hole transport layers 40 (40R, 40G and 40B), organic light emitting layers 50 (50R, 50G and 50B) and counter electrodes 60. Further, hole transport layer 40R, hole transport layer 40G and hole transport layer 40B differ in the thickness and the volume from each other.

With the organic EL display illustrated in FIG. 5, the bank is two-step bank 100' including lower layer bank 100'-1 and upper layer bank 100'-2. Lower layer bank 100'-1 mainly defines hole transport layer 40, and upper layer bank 100'-2 defines mainly organic light emitting layer 50.

Similar to the organic EL display illustrated in FIG. 4, the taper angle (γR, γG and γB) of the tapered face of lower layer bank 100'-1 of the organic EL display illustrated in FIG. 5 varies per organic light emitting element R, G and B. The taper angle (γR', γG' and γB') of the tapered face of the upper layer bank may vary per organic light emitting element R, G and B, or may be the same.

As described above, organic light emitting layers 50R, 50G and 50B of the organic EL display according to the present invention differ in a material component. Hence, the physicality of a coating solution including each organic light emitting material also differs. Hence, it is necessary to adjust the shape of the banks according to the physicality of the solution. Organic EL display 1' can control the shape of organic light emitting layer 50 in upper layer bank 100'-2 while controlling the shape of hole transport layer 40 in lower layer bank 100'-1.

Figure 6:
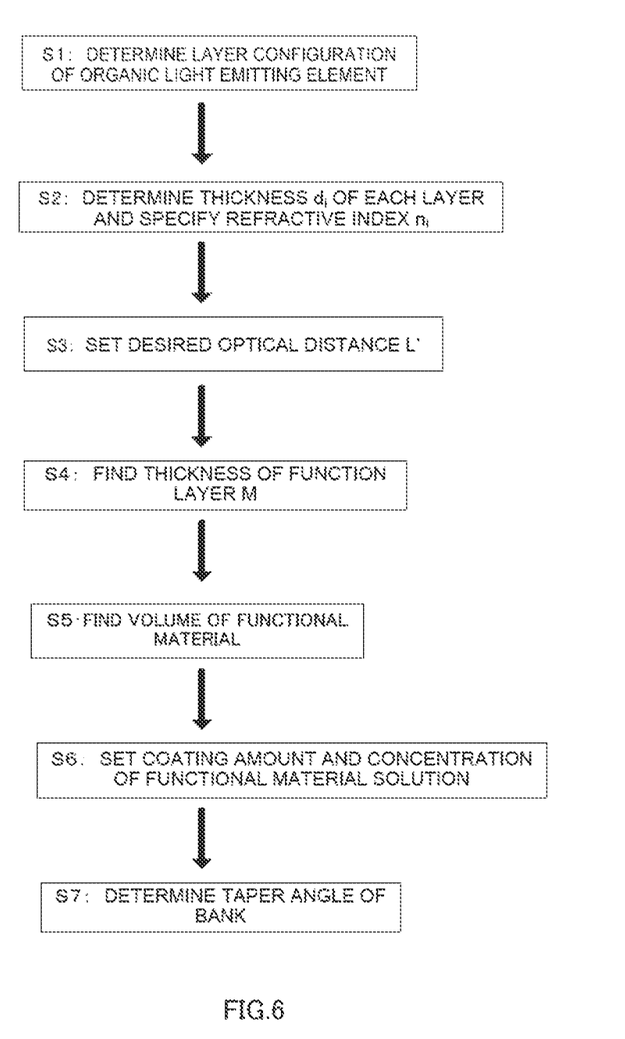
FIG. 6 is a view illustrating a flow of design process of an organic light emitting element included in the organic EL display according to the present invention.

The flow of design process of each organic light emitting element in the organic EL display according to the present invention will be described with reference to FIG. 6.

First, the layer configuration of the organic light emitting element is set (S1). The layer configuration of the organic light emitting element includes at least the pixel electrode, organic light emitting layer and counter electrode. One of the pixel electrode and counter electrode is set as the reflective electrode, and the other one is set as the transparent electrode. The function layer M formed by coating is further arranged between the organic light emitting layer and reflective electrode. According to the thickness of the function layer M, the optical distance L of the organic light emitting element is adjusted.

The layer configuration of the organic light emitting element is determined, and then the thickness of a layer other than function layer M for adjusting the optical distance is determined. Particularly, determining the thickness $d_i$ of the organic light emitting layer and each layer of the organic light emitting layer and reflective electrode is important. Further, the refractive index $n_i$ of the organic light emitting layer and each layer between the organic light emitting layer and reflective electrode is calculated (S2).

Next, the light emission wavelength α from the organic light emitting layer is calculated. The light emission wavelength α from the organic light emitting layer depends on an organic light emitting material. As described above, the optical distance L needs to satisfy the following equation to increase the light extraction efficiency, and therefore a desired optical distance L' satisfying the following equation is set (S3).

$$L' = \frac{2n+1}{4}\lambda \quad \text{[Formula 3]}$$
$$(n = 0, 1, 2, \ldots)$$

Further, the thickness of the function layer M is determined to satisfy the optical distance L'. That is, the thickness of each layer other than the function layer M is determined in advance, and the thickness and refractive index of each layer other than the function layer M may be applied to the following equation to determine the thickness of the function layer M (S4).

$$L' = \sum_i n_i d_i \quad \text{[Formula 4]}$$

After the thickness of the function layer M is determined, the volume of the functional material required to form the function layer M having this thickness is calculated (S5). From the volume of the required functional material, the capacity of the functional material solution provided to the coating area and the concentration of the functional material solution are specified (S6). The capacity of the functional material solution to be provided is influenced by the area of the coating area or the height of the bank.

From, for example, the functional material solution from which the coating capacity and concentration are specified, and surface free energy of the bank which defines the coating area, the taper angle of the tapered face of the bank which defines the coating area is determined taking into account the mode of drying the functional material solution (S7). Generally, as described above, when the coating capacity of the functional material solution is greater and the concentration is higher, the taper angle of the bank is greater, and, when the coating amount of the functional material solution is less and the concentration is lower, the taper angle of the bank is smaller.

This process is applied to organic light emitting element R, light emitting element G and light emitting element B, respectively.

An organic EL device simulator setfos (semiconducting emissive thin film optics simulator) may be used to determine the thickness of the function layer M.

Hereinafter, a more specific design example of an organic electric field light emitting element (the top emission type which extracts light through the counter electrode) will be described.

Design Example 1

Pixel electrode: APC electrode
Hole injection layer: tungsten oxide (WOx), film thickness $d_1$ (=100 nm) and refractive index $n_1$
Hole transport layer: polyaniline, film thickness $d_2$ and refractive index $n_2$
Organic light emitting layer: polyfluorene which emits red light, green light or blue light (light emission wavelength α), film thickness $d_3$ (=50 nm) and refractive index $n_3$
Counter electrode: ITO electrode
Tungsten oxide which is the hole injection layer is collectively formed by spattering, and therefore it is difficult to change the film thickness per element. Although the organic light emitting layer is formed by a coating method (inkjet printing method) and therefore it is possible to change the film thickness per element, the film thickness of the organic light emitting layer is significantly influenced by the light emission efficiency or longevity of the element. Therefore, the degree of freedom of the film thickness of the organic light emitting layer is strictly limited, and it is difficult to use the organic light emitting layer as the function layer or adjusting the optical distance.

Hence, the hole transport layer is used as the function layer (function layer M) for adjusting the optical distance.

The optical distance L according to design example 1 is represented by $L = n_1 d_1 + n_2 d_2 + n_3 d_3$. By contrast with this, when the optical distance L satisfies $L = (2n+1)\lambda/4$, the light extraction efficiency increases. Therefore, to satisfy the optical distance and light extraction efficiency, the thickness $d_2$ of the hole transport layer is set.

Figure 7:
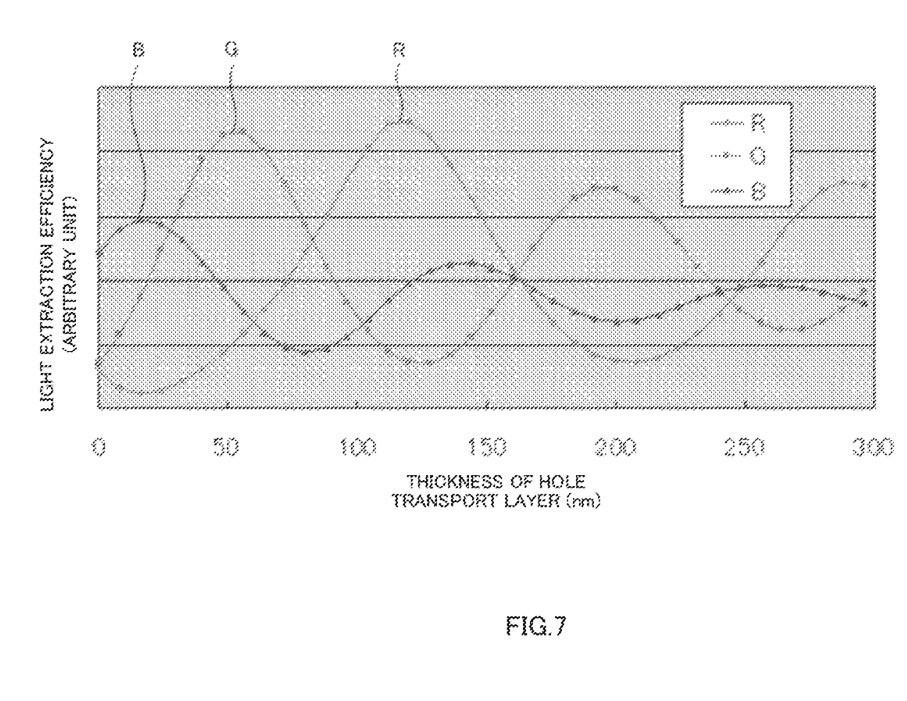
FIG. 7 is a graph illustrating a relationship between a light extraction efficiency and a thickness of a hole transport layer according to design example 1.

The analysis result of the organic EL device simulator setfos is illustrated in the graph of FIG. 7. The vertical axis indicates the light extraction efficiency, and the horizontal axis indicates thickness $d_2$ of the hole transport layer. As illustrated in the graph of FIG. 7, the optimal thickness $d_2$ varies per R, G and B. For example, the element R has a higher light extraction efficiency when the thickness of the hole transport layer is about 120 nm, the element G has a higher light extraction efficiency when the thickness of the hole transport layer is about 56 nm and the element B has a higher light extraction efficiency when the thickness of the hole transport layer is about 16 nm.

Further, although not illustrated in the graph, if the thickness of the hole injection layer is changed from 100 nm to 180 nm to decrease the film thickness of the hole transport layer of the element R, the element R has a higher light extraction efficiency when the hole transport layer is 18 nm, the element G has a higher light extraction efficiency when the hole transport layer is 90 nm and the element B has a higher light extraction efficiency when the hole transport layer is 34 nm. Thus, it is necessary to adjust the thickness of the hole transport layer.

It naturally follows that, when another layer is added between the organic light emitting layer and reflective pixel electrode, it is necessary to adjust the thickness of the hole transport layer.

Based on the resulting thickness, the concentration of the coating material for forming the hole transport layer is found, the contact angle of the bank is calculated and the taper angle of the tapered face of the bank is set. Consequently, it is possible to provide an organic EL display of the adjusted optical distance and a high light extraction efficiency.

Design Example 2

Pixel electrode: APC electrode (200 nm)
Hole injection layer: tungsten oxide (WOx), film thickness $d_1$ (=100 nm) and refractive index $n_1$
Hole transport layer: copolymer including fluorene unit and triphenylamine unit, film thickness $d_{2'}$, refractive index $n_{2'}$ (the hole transport layer having a different refractive index from design example 1 is used)
Organic light emitting layer: polyfluorene which emits red light, green light or blue light (light emission wavelength α), film thickness $d_3$ (=50 nm) and refractive index $n_3$
Electronic transport layer: barium, film thickness $d_4$ (=5 nm) and refractive index $n_4$
Counter electrode: MgAg electrode (film thickness 10 nm)

The optical distance L according to design example 2 is represented by $L=n_1 d_1 + n_{2'} d_{2'} + n_3 d_3$. By contrast with this, when the optical distance L satisfies $L=(2n+1)\lambda/4$, the light extraction efficiency increases. Therefore, to satisfy the optical distance and light extraction efficiency, the thickness $d_{2'}$ of the hole transport layer is set.

Figure 8:
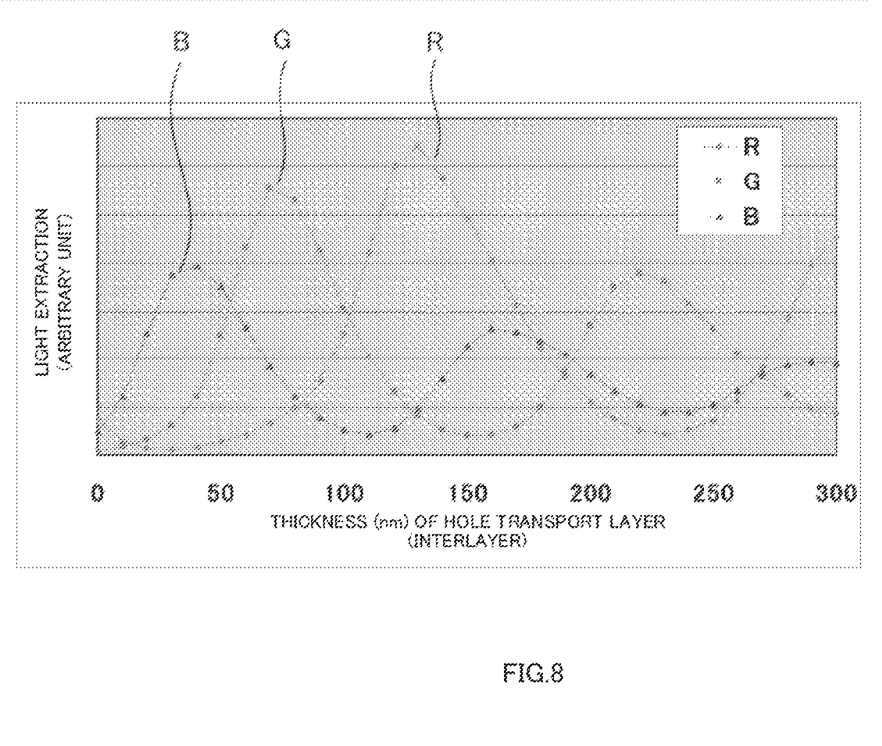
FIG. 8 is a graph illustrating a relationship between a light extraction efficiency and a thickness of a hole transport layer according to design example 2.

The analysis result of the organic EL device simulator setfos is illustrated in the graph of FIG. 8. Similar to the graph illustrated in FIG. 7, the vertical axis indicates the light extraction efficiency, and the horizontal axis indicates thickness $d_2$ of the hole transport layer. As illustrated in the graph of FIG. 8, the element R has a higher light extraction efficiency when the thickness of the hole transport layer is about 140 nm, the element G has a higher light extraction efficiency when the thickness of the hole transport layer is about 70 nm and the element B has a higher light extraction efficiency when the thickness of the hole transport layer is about 40 nm.

The present application claims priority based on Japanese Patent Application No. 2009-140542 filed on Jun. 11, 2009. The matters disclosed in the specification and drawings of Japanese Patent Application No. 2009-140542 are incorporated in the present application.

INDUSTRIAL APPLICABILITY

The present invention can provide an organic EL display of a high brightness and high contrast according to a coating method.

DESCRIPTION OF REFERENCE NUMERALS

1 SUBSTRATE
2 REFLECTIVE ELECTRODE
3 FUNCTION LAYER FORMED BY COATING
4 ORGANIC LIGHT EMITTING LAYER
5 TRANSPARENT ELECTRODE
7 BANK
7-1 TAPERED FACE OF BANK
8 COATING AREA
9 FUNCTION LAYER
10 SUBSTRATE
20 PIXEL ELECTRODE
30 HOLE INJECTION LAYER
40, 40R, 40G, 40B HOLE TRANSPORT LAYER
50, 50R, 50G, 50B ORGANIC LIGHT EMITTING LAYER
60 COUNTER ELECTRODE
100 BANK
100R, 100G, 100B TAPERED FACE OF BANK
100' TWO-STEP BANK
100'-1 LOWER LAYER BANK
100'-2 UPPER LAYER BANK
R ORGANIC LIGHT EMITTING ELEMENT WHICH EMITS RED LIGHT
G ORGANIC LIGHT EMITTING ELEMENT WHICH EMITS GREEN LIGHT
B ORGANIC LIGHT EMITTING ELEMENT WHICH EMITS BLUE LIGHT

The invention claimed is:

1. An organic EL display comprising: a substrate;
an organic light emitting element R which is arranged on a surface of a substrate and is configured to emit red light;
an organic light emitting element G which is arranged on the surface of the substrate and is configured to emit green light; and
an organic light emitting element B which is arranged on the surface of the substrate and is configured to emit blue light, wherein:
each of the organic light emitting elements includes a pixel electrode which is a reflective electrode, a function layer which is formed by coating on the pixel electrode, an organic light emitting layer which is arranged on the function layer, a counter electrode which is a transparent electrode and is arranged on the organic light emitting layer and a bank of a tapered shape which defines the function layer formed by coating, the functional layer and the organic light emitting layer being stacked between the pixel electrode and the counter electrode;
a volume of the function layer formed by coating differs among the element R, the element G and the element B, wherein
the function layer formed by coating is an electronic block layer, a hole transport layer, or a hole injection layer, the function layer included in each of the element R, the element G and the element B is made of the same functional material, and
a volume of the functional material of the element B is larger than a volume of the functional material of the element G, and the volume of the functional material of the element G is larger than a volume of the functional material of the element R, and
a taper angle of a tapered surface of the bank that defines the element B is larger than a taper angle of the tapered surface of the bank that defines the element G, and the taper angle of the tapered surface of the bank that defines the element G is larger than the taper angle of the tapered surface of the bank that defines the element R,
the taper angle of the tapered surface of the bank that defines the element B is formed between a plane parallel to a plane of the surface of the substrate and the tapered surface of the bank that defines the element B, the taper angle of the tapered surface of the bank that defines the element G is formed between the plane parallel to the plane of the surface of the substrate and the tapered surface of the bank that defines the element G, and the taper angle of the tapered surface of the bank that defines the element R is formed between the plane parallel to the plane of the surface of the substrate and the tapered surface of the bank that defines the element R.

2. An organic EL display comprising: a substrate;
an organic light emitting element R which is arranged on a surface of a substrate and is configured to emit red light;
an organic light emitting element G which is arranged on the surface of the substrate and is configured to emit green light; and an organic light emitting element B which is arranged on the surface of the substrate and is configured to emit blue light, wherein:

each of the organic light emitting elements includes a pixel electrode which is a transparent electrode, an organic light emitting layer which is arranged on the pixel electrode, a function layer which is formed by coating on the organic light emitting layer, a counter electrode which is a reflective electrode and is arranged on the function layer and a bank of a tapered shape which defines the function layer formed by coating, the functional layer and the organic light emitting layer being stacked between the pixel electrode and the counter electrode;

a volume of the function layer formed by coating differs among the element R, the element G and the element B, wherein the function layer formed by coating is an electronic transport layer or a transparent conductive film, the function layer included in each of the element R, the element G and the element B is made of the same functional material, and a volume of the functional material of the element B is larger than a volume of the functional material of the element G, and the volume of the functional material of the element G is larger than a volume of the functional material of the element R, and a taper angle of the tapered surface of the bank that defines the element B is larger than a taper angle of the tapered surface of the bank that defines the element G, and the taper angle of the tapered surface of the bank that defines the element G is larger than the taper angle of the tapered surface of the bank that defines the element R, the taper angle of the tapered surface of the bank that defines the element B is formed between a plane parallel to a plane of the surface of the substrate and the tapered surface of the bank that defines the element B, the taper angle of the tapered surface of the bank that defines the element G is formed between the plane parallel to the plane of the surface of the substrate and the tapered surface of the bank that defines the element G, and the taper angle of the tapered surface of the bank that defines the element R is formed between the plane parallel to the plane of the surface of the substrate and the tapered surface of the bank that defines the element R.

* * * * *